US012738476B2

(12) United States Patent
Adelung et al.

(10) Patent No.: US 12,738,476 B2
(45) Date of Patent: Sep. 15, 2026

(54) METHOD FOR PRODUCING A CYCLICALLY STABLE SILICON ANODE FOR SECONDARY BATTERIES, AND SILICON ANODE FOR SECONDARY BATTERIES

(71) Applicant: Christian-Albrechts-Universitaet zu Kiel, Kiel (DE)

(72) Inventors: Rainer Adelung, Kiel (DE); Sandra Hansen, Osterroenfeld (DE); Joerg Bahr, Altenholz-Klausdorf (DE); Juergen Carstensen, Kiel (DE)

(73) Assignee: Christian-Albrechts-Universitaet zu Kiel, Kiel (DE)

( * ) Notice: Subject to any disclaimer, the term of this patent is extended or adjusted under 35 U.S.C. 154(b) by 940 days.

(21) Appl. No.: 17/798,124

(22) PCT Filed: Feb. 3, 2021

(86) PCT No.: PCT/DE2021/100100

§ 371 (c)(1),
(2) Date: Aug. 8, 2022

(87) PCT Pub. No.: WO2021/160212

PCT Pub. Date: Aug. 19, 2021

(65) Prior Publication Data

US 2023/0075928 A1 Mar. 9, 2023

(30) Foreign Application Priority Data

Feb. 11, 2020 (DE) ..................... 10 2020 103 469.5

(51) Int. Cl.
*H01M 4/1395* (2010.01)
*C25F 3/12* (2006.01)
(Continued)

(52) U.S. Cl.
CPC ............. *H01M 4/1395* (2013.01); *C25F 3/12* (2013.01); *C30B 29/06* (2013.01); *C30B 33/10* (2013.01);
(Continued)

(58) Field of Classification Search
CPC .. H01M 4/1395; H01M 4/044; H01M 4/0452; H01M 4/134; H01M 4/386;
(Continued)

(56) References Cited

U.S. PATENT DOCUMENTS 7,208,069 B2 4/2007 Christophersen et al.
2012/0231326 A1* 9/2012 Biswal .................. H01M 4/134 977/734
2016/0118643 A1 4/2016 Bahr et al.

FOREIGN PATENT DOCUMENTS

DE 10318995 A1 11/2004
DE 10318995 B4 4/2006
(Continued)

OTHER PUBLICATIONS

KR-20180022706-A. Mar. 6, 2018. English machine translation by EPO. (Year: 2018).*
(Continued)

*Primary Examiner* — James Lee
(74) *Attorney, Agent, or Firm* — Patent Central LLC; Stephan A. Pendorf

(57) ABSTRACT

A method for producing a silicon anode for secondary batteries. Mesoporous silicon is used for the anode to provide space for volume expansion in the course of intercalation, especially of lithium ions. However, instead of coating a metal film with silicon, here metal is deposited onto a monocrystalline etched silicon wafer. It is essential that the silicon is monocrystalline and that the two flat sides
(Continued)

Figure 1:
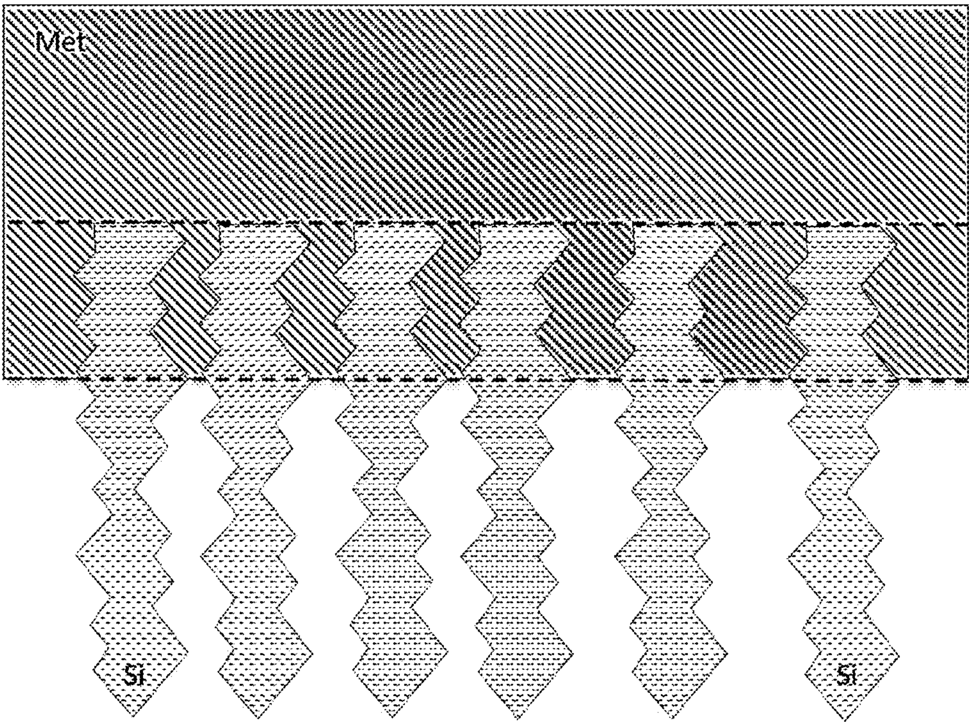

of the wafer are (100)-oriented, i.e., perpendicular to the (100)-direction of the volumetric crystal.

12 Claims, 7 Drawing Sheets

(51) Int. Cl.

| | |
|---|---|
| ***C30B 29/06*** | (2006.01) |
| ***C30B 33/10*** | (2006.01) |
| ***H01M 4/04*** | (2006.01) |
| ***H01M 4/134*** | (2010.01) |
| ***H01M 4/38*** | (2006.01) |
| ***H01M 4/62*** | (2006.01) |
| *H01M 4/02* | (2006.01) |

(52) U.S. Cl.
CPC ......... *H01M 4/044* (2013.01); *H01M 4/0452* (2013.01); *H01M 4/134* (2013.01); *H01M 4/386* (2013.01); *H01M 4/626* (2013.01); *H01M 2004/021* (2013.01); *H01M 2004/027* (2013.01)

(58) Field of Classification Search
CPC ........... H01M 4/626; H01M 2004/021; H01M 2004/027; C25F 3/12; C30B 29/06; C30B 33/10
See application file for complete search history.

(56) References Cited

FOREIGN PATENT DOCUMENTS

| | | | | | |
|---|---|---|---|---|---|
| DE | 102008012479 B3 | | 5/2009 | | |
| DE | 102009035745 A1 | | 2/2011 | | |
| DE | 102009056530 A1 | | 6/2011 | | |
| DE | 102015120879 A1 | | 6/2017 | | |
| EP | 2460214 B1 | | 1/2016 | | |
| KR | 20180022706 A | * | 3/2018 | ............ | H01M 4/133 |

OTHER PUBLICATIONS

International Search Report issued on May 6, 2021, in International Application No. PCT/DE2021/100100.

Munoz-Noval Alvaro, et al.: "Accelerated growth from amorphous clusters to metallic nanoparticles observed in electrochemical deposition of platinum within nanopores of porous silicon", Electrochemistry Communications, Elsevier Amsterdam, Netherlands, vol. 71, pp. 9-12, Jul. 28, 2016 (Jul. 28, 2016), XP029723135, DOI: http://dx.doi.org/10.1016/j.elecom.2016.07.013, ISSN: 1388-2481.

Korotcenkov G., et al.: "Silicon Porosification: State of the Art", Critical Reviews in Solid State and Materials Sciences, US, vol. 35, No. 3, pp. 153-260, Aug. 31, 2010 (Aug. 31, 2010), DOI: http://dx.doi.org/10.1080/10408436.2010.495446, ISSN 1040-8436, XP055710747.

Hansen, Sandra, et al.: "Corset-like solid electrolyte interface for fast charging of silicon wire anodes", Journal of Power Sources, Feb. 7, 2018 Elsevier, Amsterdam, Netherlands, vol. 381, pp. 8-17, ISSN 0378-7753, DOI: http://dx.doi.org/10.1016/j.jpowsour.2018.01.085, XP085356454.

* cited by examiner

METHOD FOR PRODUCING A CYCLICALLY STABLE SILICON ANODE FOR SECONDARY BATTERIES, AND SILICON ANODE FOR SECONDARY BATTERIES

The invention relates to a process for the production of silicon anodes for secondary batteries—also: accumulators —, in particular for lithium-ion batteries, as well as a silicon anode that can be produced with the process.

Silicon-based anodes are known to be beneficial in lithium-ion batteries. The performance of a rechargeable lithium-ion battery is measured in stored energy per mass (unit: mAh/g). A decisive factor here is how much lithium can be stored in the two electrodes—anode and cathode—per gram of electrode mass. Other quality-determining factors for secondary batteries, which depend to a large extent on the electrodes, are storage stability, i.e., the possible damage-free service life of an unloaded battery, the extent of self-discharge, the speed of recharging and cycling stability. Cycling is the repeated complete charging and discharging of the battery (charge cycle), and a cycle-stable battery shows very little—ideally no—loss of capacity over a large number of charge cycles.

Despite all the technological excellence of known battery concepts, the manufacturing costs, i.e. the price-performance ratio, must nevertheless be kept within marketable limits. Particularly for accumulators with very high storage capacity, for example for electromobility or home energy storage, there are still deficits here, which are due on the one hand to safety requirements and on the other hand to the manufacturing costs of large-area and robust electrodes.

In terms of safety, silicon battery electrodes are advantageous because they could replace the previously used carbon (graphite electrodes), which significantly reduces the battery's fire hazard. It has long been known that silicon can store (intercalate) about 11 times more lithium per gram of silicon than a technically common graphite anode, forming silicon-lithium compounds. With a theoretical capacity of over 4000 mAh/g, it is even higher than that of metallic lithium. However, early attempts to use silicon anodes failed because virtually no cycling stability was achieved. The reason for the extremely poor cycling stability of silicon lies in the volume expansion of the silicon to four times its original size associated with lithium intercalation. The mechanical stresses that occur are so great that the material is pulverized as a result.

For the anode of a lithium-ion battery, the work of Chan et al. ("High-performance lithium battery anodes using silicon nanowires", Nature Nanotechnology 3, 31 (2008)) proposes to arrange silicon nanowires standing on a metal film (charge collector). The work by Chan et al. grows silicon nanowires on, for example, a steel substrate using known techniques (in this case, liquid-vapor-solid, LVS). The nanowires are flexible and can double in diameter without breaking. The nanostructuring of the silicon both increases the surface area to accommodate lithium ions and creates space to avoid the aforementioned mechanical stresses. However, the fabrication process of Chan et al. is cumbersome and expensive. Growing the silicon nanowires using LVS methods requires gold particles as nucleation seeds that remain at the tips of the nanowires. The nanowires themselves are saturated with gold, which makes the production of thicker wires or on larger areas very expensive. Moreover, the nanowires obtained are not homogeneous. There are thick and thin, long and short, upright and bent, fixed and detached nanowires on the substrate. Silicon nanowires not in contact with the metal film are particularly undesirable in commercial manufacturing. They do not contribute anything to the capacity of the battery, but still absorb lithium ions during the first charge, which are no longer extractable (irreversible capacity). And of course, in the Chan et al. process, these are also saturated with gold.

EP 2 460 214 B1 pursues the goal of preventing the silicon columns from detaching from a metal film as completely as possible during cycling by providing the columns with subsections in the area of their base points that are enclosed by the metal film, with the metal film being at least one micrometer thick. The columns of monocrystalline silicon embedded in this way are held in place by the metal film—in this case made of copper—and are also prevented from picking up lithium ions in the enclosed subsections. They remain firmly anchored during cycling and thus in low-resistance contact with the metallic arrester. Moreover, in EP 2 460 214 B1 all columns are of the same thickness, the same height, crystallographically oriented in the same way and even regularly arranged, which is due to the manufacturing process described there. The nanopillars are formed as a regular array on a silicon wafer by the targeted overetching of macropores, after which the metal film is galvanically deposited at the feet of the standing pillars and subsequently detached from the wafer by the application of thermal or mechanical force. The embedded silicon columns remain in the metal film and are torn off the wafer. It should be pointed out that a silicon anode according to EP 2 460 214 B1 does not show any loss of capacity even after hundreds of charging cycles. However, the manufacturing process is hardly suitable for large-area production, among other things because both etching—relatively deep—macropores and electroplating are time-consuming and, moreover, large parts of the expensive wafer material cannot be used efficiently.

Other approaches to creating silicon-based electrodes for lithium-ion batteries involve various powders of silicon crystallites, for example Si fracture particles of a wafer, mixed with electrically conductive particles, for example carbon black, which are further mixed with an organic binder and applied as a thick film to metal sheets. The isolated Si particles can intercalate lithium, increasing their volume, without the need for significant mechanical stresses in the layers, for example because the matrix of a layer can absorb the mechanical forces by deformation if necessary. Nevertheless, the mechanical stresses do not remain without consequences in the long term, but lead over time, for example, to the interruption of the electrical contact between silicon and the dissipating electrode, possibly even to the detachment of the coating, and thus to a loss of capacitance.

As a silicon anode for lithium-ion batteries, DE 10 2015 120 879 A1 proposes coating a copper film with silicon, whereby the silicon is deposited from the gas or liquid phase, and then etching mesoporous pores into the silicon. According to the IUPAC definition, mesoporous pores are those with pore diameters between 2 and 50 nm. The intended porosity (=proportion of pore volume to coating volume) is 60-90%, which is intended to provide internal void space for the silicon coating to expand in volume under lithium loading. Since silicon adheres poorly to copper, the work provides for an additional adhesion promoter film containing titanium, nickel or vanadium, placed between the copper film and the deposited silicon film. The silicon is p-doped during deposition to facilitate single-sided electrochemical etching of mesopores. The authors discuss cycling stability only in paragraph 0048 of the print: "Compared to the industrially established carbon-based materials, the capacity is increased by a factor of 4, but the cycling stability is still lower so far."

It should be noted that mesopores can also be electrochemically etched into a silicon wafer using suitable process parameters. Doping of the silicon can be helpful, but is not critical for creating mesopores in Si single crystals. In particular, by changing the etching parameters during the etching process, one can selectively create different pore morphologies at different depths of a wafer. This is a complex but mastered art in the prior art.

It is the object of the invention or task to propose a cost-effective, large-scale applicable process for the production of cycle-stable silicon anode for secondary batteries.

The task is solved by a method for producing a silicon anode for secondary batteries, characterized by the steps of:

a. providing a monocrystalline silicon wafer with (100)-oriented flat sides;
b. contacting the rear side of the wafer with a flat first electrode;
c. introducing the front side of the wafer into an etching bath having a hydrofluoric acid-containing electrolyte and a second electrode;
d. electrochemically etching mesopores of at least 4 micrometers pore depth into the front side of the silicon wafer by establishing a predetermined etching current density while
e. generating a porosity between 40% and 80% in the mesoporous layer;
f. generating a microporous release layer below the mesoporous layer by increasing the etching current density;
g. placing the etched wafer in an electroplating bath;
h. electrodepositing an elemental metal into the etched mesopores to a predetermined pore depth less than 2 micrometers;
i. depositing a metal layer at least a few micrometers thick onto the etched front side of the wafer while producing electrically conductive and mechanically adherent contacts of the metal layer with the elemental metal in the mesopores;
j. lifting off the metal layer and the mesoporous, monocrystalline, (100)-oriented silicon layer partially filled with elemental metal in the mesopores while mechanically destroying the microporous release layer.

A subsidiary claim is directed to the silicon anode producible by the process. The subclaims indicate advantageous embodiments.

The invention takes up the idea of DE 10 2015 120 879 A1 to use mesoporous silicon for the anode to provide space for volume expansion in the course of intercalation, especially of lithium ions. However, the approach there of coating a metal film with silicon is replaced here by the opposite, namely metal deposition onto a monocrystalline etched silicon wafer. According to the invention, it is essential that the silicon is monocrystalline and that the two flat sides of the wafer are (100)-oriented, i.e., perpendicular to the (100)-direction of the volumetric crystal.

It should be noted that the silicon deposited on a metal film according to DE 10 2015 120 879 A1 is anything but monocrystalline. For this reason alone, the print points in a completely different direction.

Along the (100)-direction, a particularly fast growth of the silicon crystal is possible. It can therefore be assumed that a (100)-oriented surface has a strong ordering effect on mobile silicon atoms. However, in order to take advantage of this, the crystal structure of the silicon anode must never be completely lost, despite the considerable restructuring of the silicon during the charging cycles. According to the invention, the crystal structure is therefore "frozen" in a portion of the mesoporous silicon by electrodepositing an elemental metal down to a predetermined pore depth. The deposited elemental metal, preferably copper or nickel, is mechanically solid and incompressible and deprives the silicon of any room for movement or volume increase up to the depth of the metal deposition, so that intercalation is prevented in the layer region filled with elemental metal. Thus, crystallinity and (100)-orientation of the silicon in this layer region are always maintained even during the charging cycles of a secondary battery. The portions of the mesoporous silicon that are not filled with elemental metal are largely restructured by the uptake of ions, but they rearrange themselves in a self-organized manner when the ions are discharged, resulting in a uniform, predictable and cycle-stable behavior of the silicon anode. It is assumed that this self-organization is made possible in the first place—or at least greatly favored—by the presence of the monocrystalline (100) surface.

A side effect of the electrodeposition of elemental metal into the etched mesopores of the wafer and the subsequent deposition of a metal film onto the same flat side of the wafer is the robust mechanical coupling between the metal film and the silicon by the key-lock principle. While the material adhesion of the elemental metal in the pores to the metal film is known to be very good, the adhesion of silicon to some metals, e.g. copper, is rather poor. However, the mesopores filled with elemental metal are usually not smooth and channel-like, but have diameters that vary with pore depth and protrusions or serrations directed laterally—i.e., perpendicular to the course of the pores. If such pores are filled with solid material, the material cannot be pulled out; rather, it is mechanically anchored by positive locking. This makes it virtually impossible to detach the area of the silicon layer filled with elemental metal from the metal film.

Figure 2:
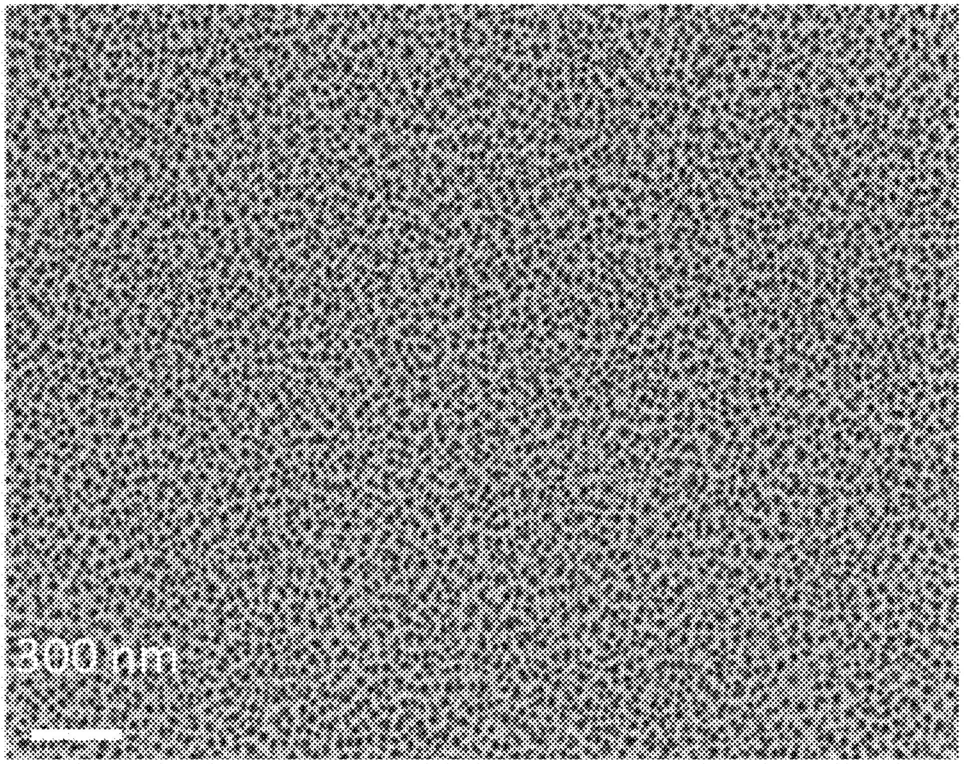
Figure 3:
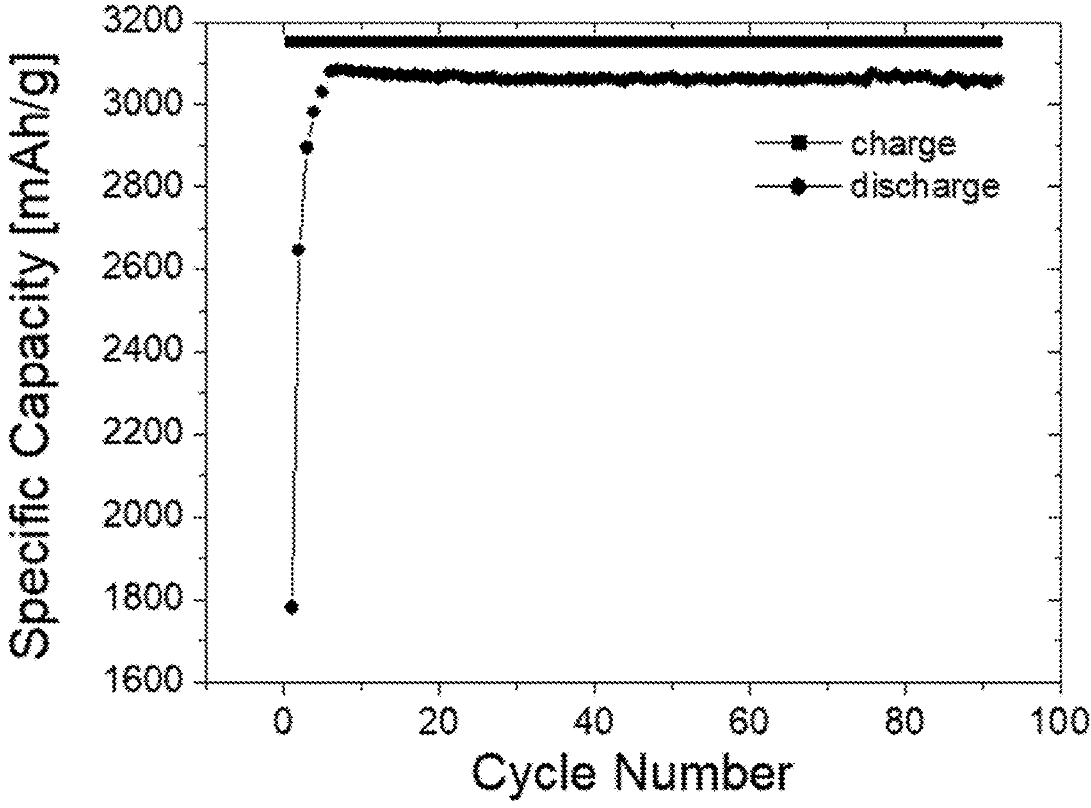
Figure 4:
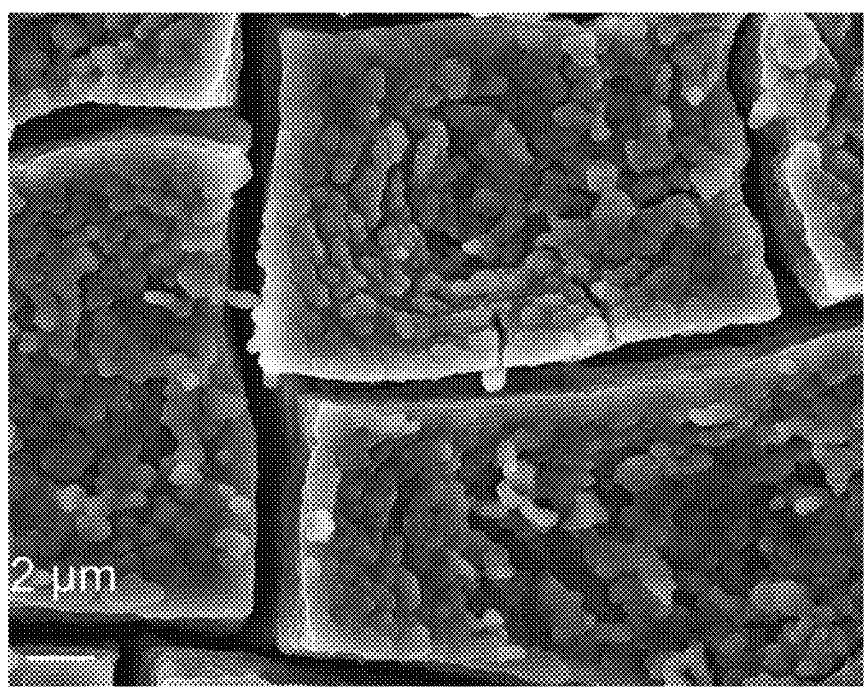
Figure 4:
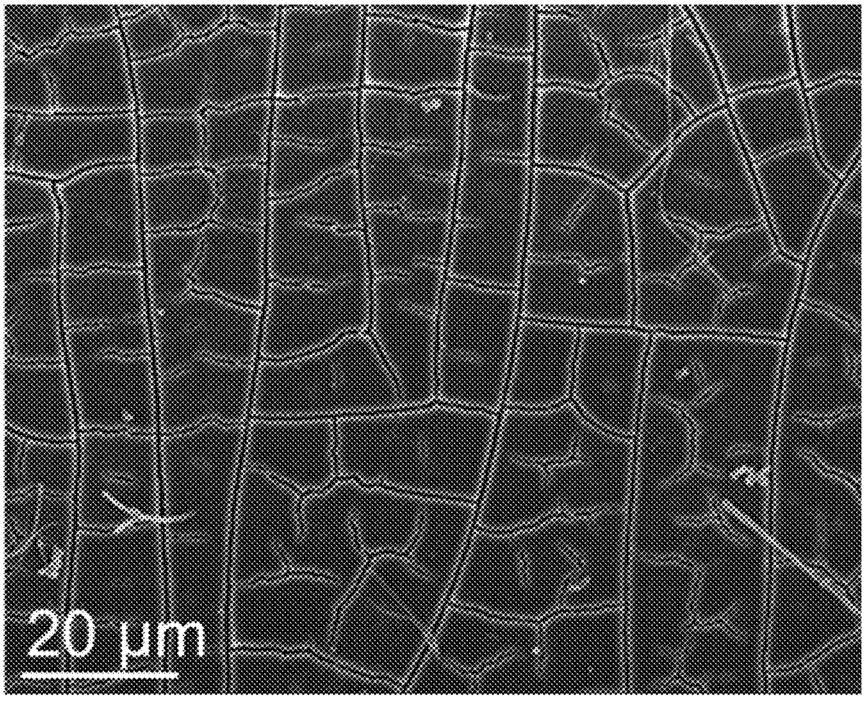
Figure 5:
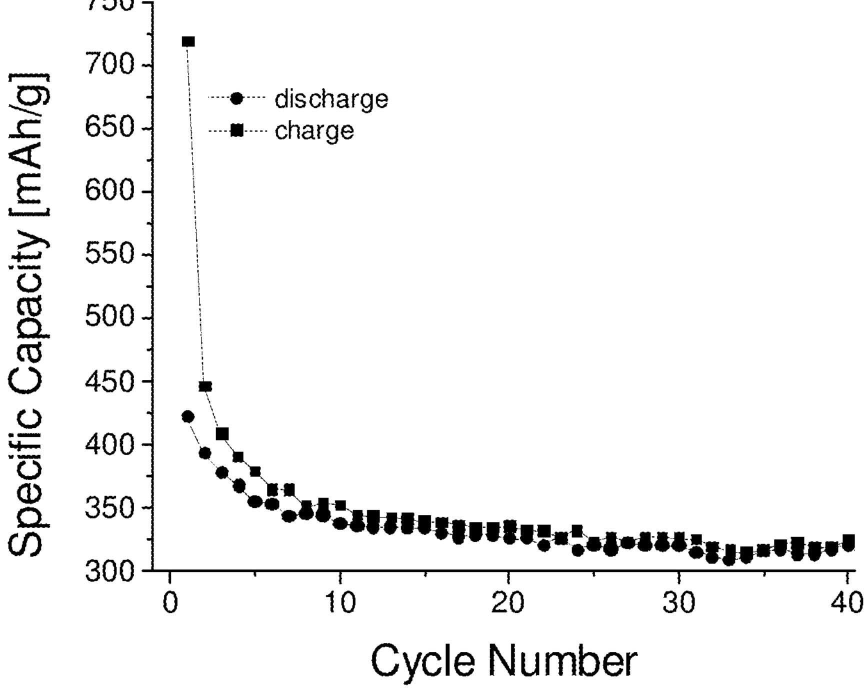
Figure 6:
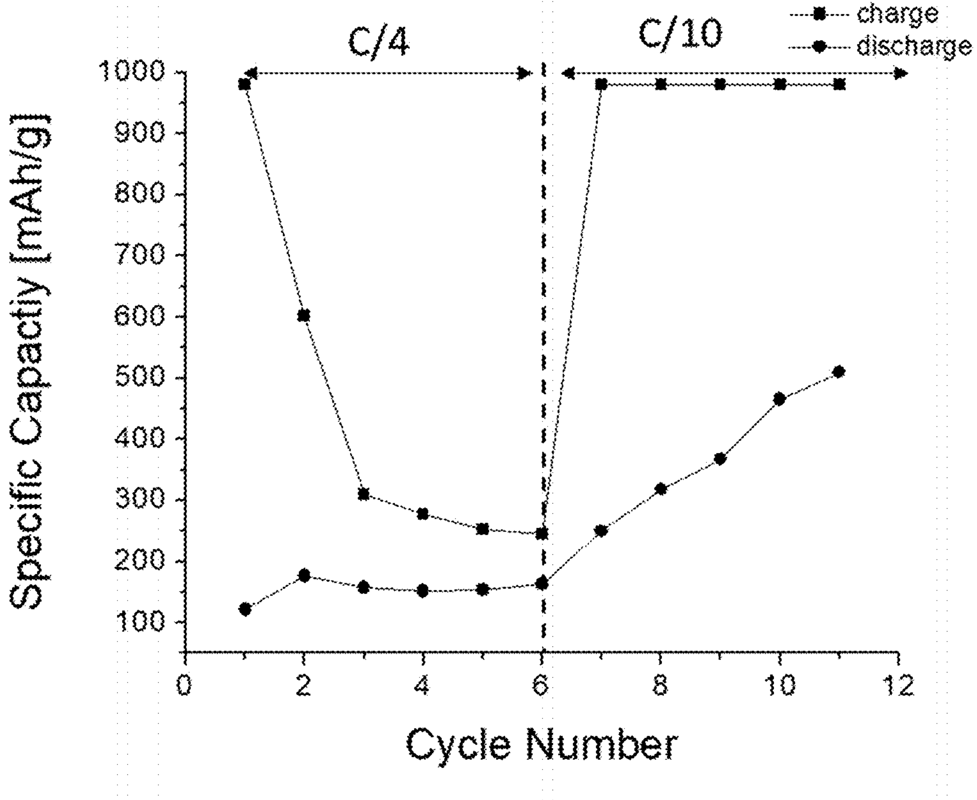
Figure 7:
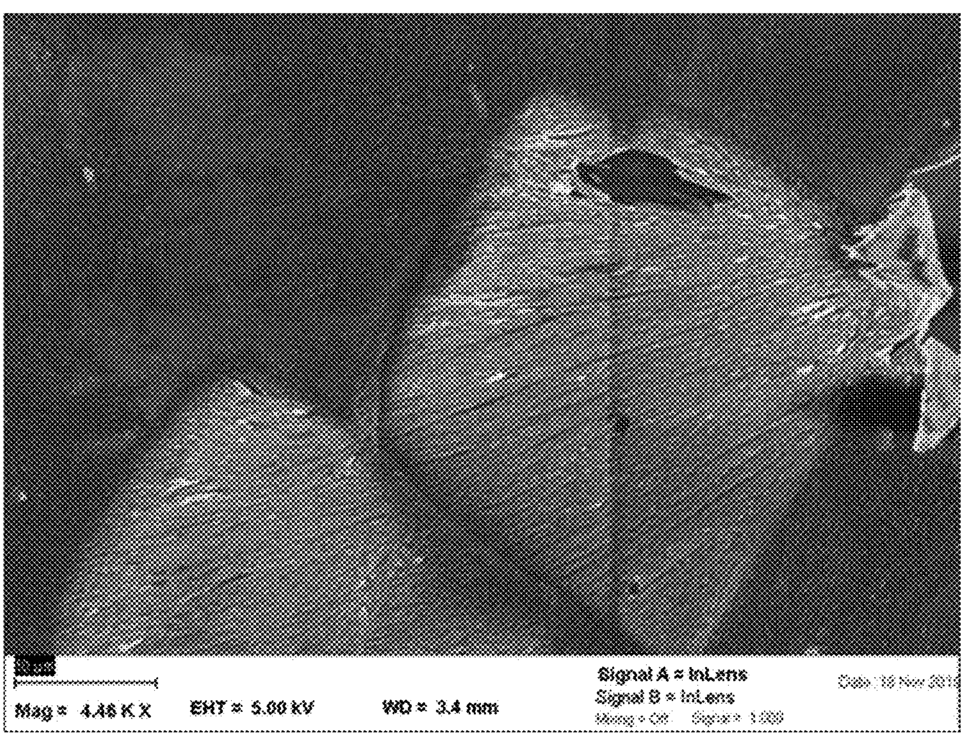
Figure 7:
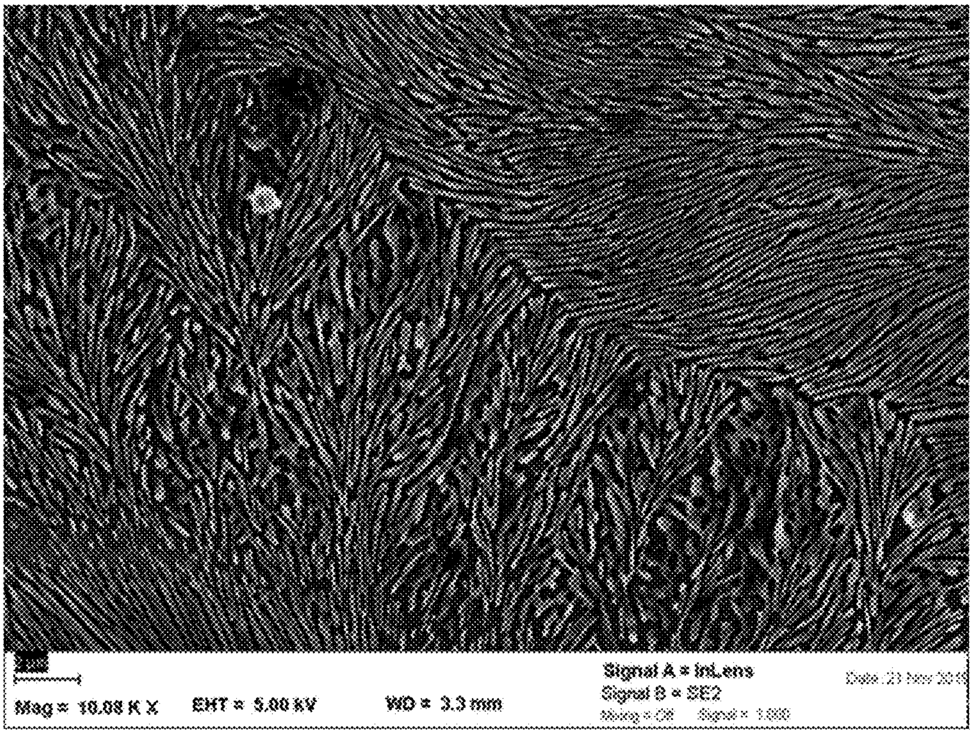
Figure 8:
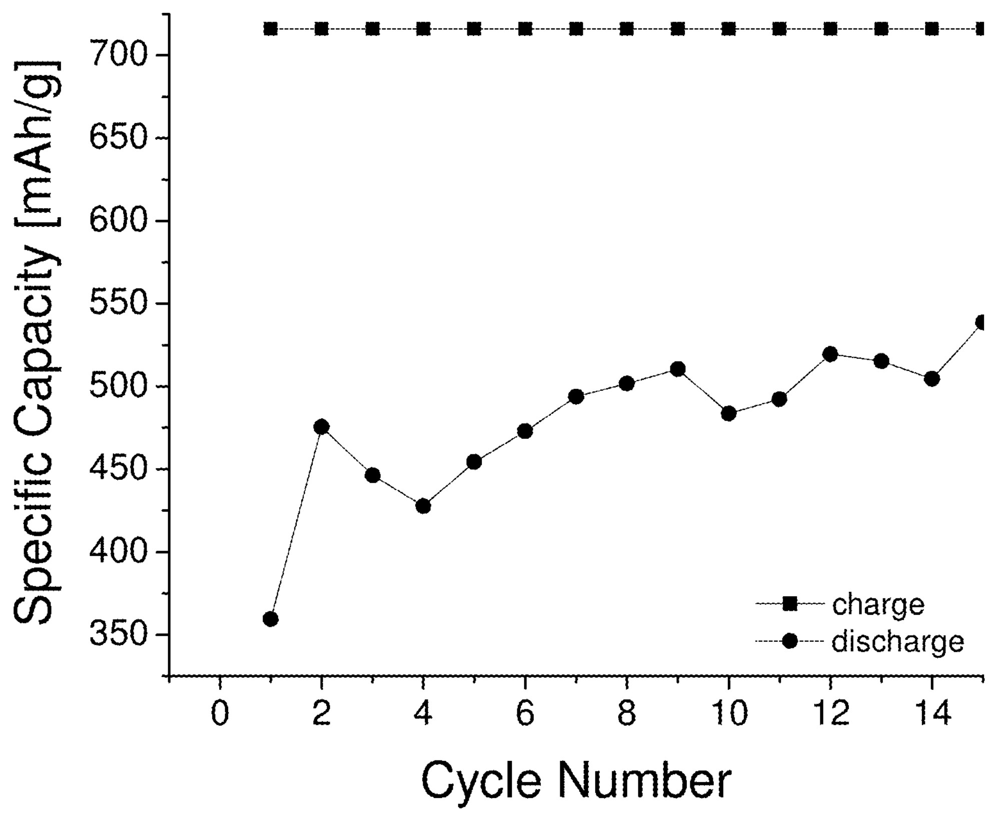

The invention is also explained in more detail below with reference to figures. Thereby show:

FIG. 1 a sketch of the silicon anode along a section perpendicular to the wafer or metal film;

FIG. 2 a scanning electron microscope (SEM) image of the mesoporous Si wafer;

FIG. 3 measured specific capacitances for the Si anode in a test cell with an electrolyte containing lithium ions during the first 100 charge cycles;

FIGS. 4 *a*) and *b*) each an SEM image of a Si anode with a 6 micrometers thick silicon layer after a few charge cycles in the lithium test cell in two magnifications;

FIG. 5 measured charge capacities for a Si anode with a layer thickness of 26 μm compared with a nickel-manganese-cobalt cathode;

FIG. 6 Specific capacitances measured for the Si anode in a test cell with an electrolyte containing sodium ions during the first 17 charge cycles;

FIGS. 7 *a*) and *b*) SEM images of the Si anode after a few charge cycles in the sodium test cell in two magnifications;

FIG. 8 Specific capacitances measured for the Si anode in a test cell with an electrolyte containing potassium ions during the first 15 charge cycles.

A monocrystalline Si wafer can be electrochemically etched by known methods to create different types of pores in the silicon. The electrochemist is familiar with the process steps a) to f) and knows how to determine the exact etching parameters (current density, etching time, electrolyte temperature and flow) if he wants to mesoporously etch a predetermined wafer batch with predetermined doping with an electrolyte composition of his choice. Only, for example, he can be guided by the publication DE 103 18 995 B4 and the sources cited therein. As already mentioned, a specific doping of the silicon is not mandatory. However, it is certainly advantageous for mesopore etching to use doped silicon. Such silicon is also generally less expensive than high-purity silicon.

The experiment shows that a p-doped silicon wafer—for example by boron—which has a resistivity of less than 10 mΩcm, preferably around 8 mΩcm, is an advantageous choice.

An etching device for large silicon wafers is known from U.S. Pat. No. 7,208,069 B2, which is also suitable for producing mesopores. For example, an aqueous solution containing 20 wt % hydrogen fluoride (HF) and 5 wt % ethanol and 1 wt % polyethylene glycol (PEG) can be used as the electrolyte; if necessary, 1 wt % sulfuric acid ($H_2SO_4$) can be added in addition to or instead of PEG. The bath temperature is usually a constant 20° C., and the current density can be set up in a typical window between 50 and 100 mA/cm$^2$, with larger values leading to greater porosity.

According to the invention, the total volume of the mesopores should be between 40% and 80% of the original silicon volume in the mesoporous etched layer. The reason for the width of the interval is explained further below. Especially for Si anodes for lithium-ion batteries, it is advantageous to set the porosity to a value between 70% and 75%.

The expert also knows—or he can easily determine by preliminary tests—how far and for how long he has to increase the etching current density in his setup in order to produce a microporous release layer with a sponge-like pore structure under the mesoporous layer. One can design the release or detachment layer to have only very thin, brittle pore walls that can be easily broken mechanically. As long as the pore walls are still intact, however, the mesoporous layer remains connected to the wafer and can be moved together with it.

According to the invention, the etched wafer is then placed in an electroplating bath containing an electrolyte with elemental metal ions. Preferably, copper or nickel ions are used for this purpose. Possible electrolytes are for example aqueous copper/nickel sulfate solutions (with a molarity of 0.25 M to 1.25 M) with additions of sulfuric acid ($H_2SO_4$) and 1 wt. % PEG (M~3360) preferably at pH between 1 and 2.7. The best results for nickel deposition are obtained with Watts solution: 200 g/l nickel sulfate ($NiSO_4$), 45 g/l nickel chloride ($NiCl_2$), 45 g/l boric acid ($H_3BO_3$). Good results can also be achieved with the aid of nickel sulfamate $Ni(SO_3NH_2)$ of 30 g/l, which is added instead of $NiSO_4$.

The electrolyte also penetrates the mesopores at least in an area close to the surface, and the mesopores are then partially filled with elemental metal by means of current flow and precipitating reduction of the ions. "Partially" here means that not the entire pore depth—which should be at least 4 micrometers—is filled with elemental metal. This is because deposition in the mesopores becomes difficult at pore depths beyond a few 100 nanometers because the electrolyte flow is too much impeded. For the purposes of the invention, metal deposition over a pore depth between a few 10 and several 100 nanometers is quite sufficient. The skilled person knows that he can influence the penetration depth of the electrolyte by, among other things, controlling the viscosity of the electrolyte.

Preferably, the metal deposition is continued until a metal layer at least a few micrometers thick has formed on the wafer surface. The metal layer and the elemental metal deposits in the mesopores are bonded together, which ensures the best electrically conductive and mechanically adherent contact. Alternatively, the metal layer can be formed from a different metal than that with which the mesopores have been filled. For example, the electrolyte can be changed or a different metallization process can be used to apply the metal layer. At the end of the manufacturing process, the metal layer must be able to freely support the silicon single crystal provided with mesopores, which adheres to the metal layer after said release layer has been destroyed separately from the wafer.

The release layer is very brittle and can be destroyed mechanically, for example by pulling the finished metal film and the mesoporous silicon single crystal off the wafer. Another possibility of mechanical destruction can be the irradiation of possibly pulsed and/or focused ultrasound into the release layer.

The result of the process is sketched in FIG. 1. In this sectional sketch, shown perpendicular to the metal film (Met) and to the Si wafer, the jagged mesopore walls (Si) are shown and the pores are shown as interstices. Between the dashed lines, the metal is deposited in the pores; thus, the pores are partially filled. In the case shown, the electrodeposition of an elemental metal in the pores has continued until a metal film at least a few micrometers thick has been formed, i.e. inside and outside the pores the metal is the same.

The thickness of the silicon layer adhering to the metal film is determined by the choice of mesopore depth during the etching process and should be at least 4 micrometers according to the invention. Preferably, the mesoporous silicon layer is 4 to 16 micrometers thick, more preferably between 6 and 12 micrometers. The etching rate in the embodiment example described above is slightly more than 2 micrometers per minute.

At first glance, FIG. 1 is reminiscent of a sketch of the Si nanowires enclosed by the metal from the publication EP 2 460 214 B1. This association would be misleading, however, because the Si drawn in FIG. 1 is completely interconnected outside the image plane. In fact, the silicon here rather encloses metal projections from the metal film.

FIG. 1 sketches the silicon anode for secondary batteries according to the invention, comprising a metal layer and a mesoporous, monocrystalline, (100)-oriented silicon layer partially filled with elemental metal in the mesopores, the elemental metal in the mesopores being in electrically conducting and mechanically adhering contact with the metal layer. The anode can be inserted directly into a lithium secondary battery with electrical leads contacted to the metal film, and an electrode of metallic lithium can serve as the cathode. The silicon side of the anode is placed facing an anhydrous electrolyte containing lithium ions. With the release layer completely removed, the silicon side looks exactly like the mesoporous etched front side of the Si wafer; this can be seen as an SEM image in FIG. 2.

In the secondary battery, for example, the following two types of electrolytes are suitable:

a) a carbonate-based electrolyte. This consists of 1 M lithium hexafluorophosphate ($LiPF_6$) dissolved in solvents ethylene carbonate (EC) and dimethyl carbonate (DMC) in a 1:1 ratio (commercially available).
b) an ether-based electrolyte. This can be produced as a solution of the salt lithium bis(trifluoromethanesulfonyl)imide (LiTFSi) in approximately a 1:2 ratio of dioxolane-1,3 (DOL) and dimethyl ether (DME).

FIG. 3 shows measured specific charge capacities of a lithium-ion test cell comprising a silicon anode with a 6 micrometers thick silicon layer and a lithium metal cathode. As is common in battery technology, charging with lithium is only carried out up to about 75% of the theoretical maximum. The discharge curve shows that the available charge capacity stabilizes at a high level after only a few cycles. From about the 20th cycle onwards, no more changes can be detected. Charging and discharging the test cell takes two hours each in the test shown.

The discharged anode, stabilized after cycling, can be removed and inspected. Under the scanning electron microscope, the silicon side shows restructuring as shown in FIG. 4 *a*) and b) in two magnifications. Tower-shaped structures have formed over the entire surface, separated from each other by cracks. The cracks form a largely continuous network and are about 1 micrometer wide. The appearance of the surface resembles that of a dried riverbed, where desiccation cracks appear as the water in the sediments evaporates. Closer examination reveals that the tower-like structures are coated on their surface with a solid solid-solution phase formed from silicon and lithium, termed the solid-electrolyte interface (SEI). This SEI is known to expand with the volume of silicon during intercalation of lithium and contract again during discharge (S Hansen, S Shree, G Neubüser, J Carstensen, L Kienle, R Adelung, "Corset-like solid electrolyte interface for fast charging of silicon wire anodes," Journal of Power Sources 381, 8-17, 2018). The SEI remains intact even when the battery is fully discharged and permanently binds a certain fraction of the lithium ions of the electrolyte. It does not tear or grow permanently, as in conventional lithium-ion batteries with graphite. It perfectly encases these cracks and gives them additional mechanical support and stability.

It is important to note here that the structure shown in FIG. 4 does not depend significantly on how many charge cycles one examines the anode after. Despite the considerable restructuring of the silicon layer during each individual charge cycle, the described flux bed structure is formed again and again. This is seen as the main reason for the measurable cycle stability of the new silicon anode. At the same time, its storage capacity is also clearly superior to the best available carbon-based anodes. The inventors estimate that a lithium-ion battery suitable for series production with the anode of the invention and the best cathodes commercially available today can be expected to at least double the charging capacity of such batteries.

FIG. 5 also shows a plot of measured charge capacities for a silicon anode according to the invention with a silicon layer of thickness 26 micrometers and a porosity of 65% at 30 nanometer pore diameter compared with a nickel-manganese-cobalt cathode. Compared to FIG. 3, the capacitance level is considerably lower, which is mainly due to the limited cathode, which cannot utilize the full capacity of the silicon anode. More important here, however, is the stability of the anode over 40 charge cycles (charge rate C/4), with charge and discharge capacities above 300 mAh/g in all cycles. Although, according to these measured values, only a relatively small fraction of the silicon layer actively participates in storing the lithium, the anchoring of the monocrystalline, (100)-oriented, mesoporous silicon layer to the metal film is necessary. Without the galvanic depositions into the mesopores to establish the lock-and-key principle, the 26 micrometer layer crumbles after only about 10 charge cycles and loses its electrical contact.

The investigations for several thicknesses of the silicon layer show that a cycle-stable silicon anode for secondary batteries can be realized with silicon layer thicknesses of at least 4 micrometers. The measurements further show that layer thicknesses between 4 and 16 micrometers, and especially between 6 and 12 micrometers, currently promise the best results—particularly efficient storage of lithium ions—and are therefore preferred.

Finally, it should be noted that silicon can also intercalate other alkali metals, especially sodium and potassium. Therefore, the silicon anode can also be inserted and cycled in a test cell with a sodium or potassium ion electrolyte and a metallic sodium or potassium cathode. For this purpose, for example, the aforementioned ether-based electrolytes are suitable, in which the salts sodium trifluoromethanesulfonimide (NaTFSi) for sodium batteries or potassium trifluoromethanesulfonimide (KTFSi) for potassium batteries are optionally dissolved.

In fact, the silicon anode according to the invention also proves suitable for use in sodium or potassium ion batteries. At least surprisingly stable charging cycles can be carried out, although some of these take even longer than with lithium.

However, because sodium or potassium cause a smaller increase in the volume of the silicon than lithium when the silicon is intercalated, it may be appropriate to design the silicon anode for this circumstance by providing a smaller porosity, in particular to a value from the interval of 40% to 60%.

For example, FIG. 6 shows a plot with measured charge capacities of a sodium test cell. Here, the anode is charged with sodium ions up to the theoretical maximum charge capacity, which, according to various sources, is around 1000 mAh/g. The measurement data includes 11 charge cycles, of which the first 6 are performed at a high charge rate of C/4. At the beginning, the sodium cathode is not yet passivated, i.e. covered with a protective layer, which explains the initially high capacity during charging. As soon as this SEI has been formed on the sodium cathode and on the silicon anode, the charging capacity then drops very significantly, while the discharging capacity remains at a low level. However, from cycle 7 onwards, the charge rate is now significantly reduced to C/10, i.e. 10 hours of charge time for a complete charge. This has the easily recognizable effect that the maximum capacity can be exploited during charging, while the discharge capacity increases with each subsequent cycle—until a final level is reached, which has not yet been reached here. The reason for the clearly improved battery behavior is that the sodium ions need sufficient time to intercalate into the silicon and to bridge the activation energy. So it is indeed possible to create a sodium-ion secondary battery with the silicon anode, which currently stores and releases electrical charge relatively slowly. But the advantage of being able to use sodium ions instead of lithium ions to store energy from photovoltaic cells, for example, definitely seems worth mentioning here.

FIG. 7 *a*) and b) show SEM images in two magnifications of the silicon anode cycled in the sodium test cell. A silicon surface wetted with thin lamellae can be seen. However, due to the reduced volume expansion of the silicon during sodiation, a much smaller crack pattern appears—especially visible in FIG. 7 *b*). It is worth emphasizing the observation that the crack pattern is repeatedly established in this way even with repeated cycling. This gives reason to expect high cycling stability of the silicon anode according to the invention also in a sodium-ion battery.

FIG. 8 shows a plot of measured charge capacities for a potassium ion test cell comprising a silicon anode and a potassium cathode according to the invention. The behavior of the cell during the first 15 charge cycles can be seen, with each charge and discharge taking 4 hours (charge rate C/4).

Interestingly, the matching problems of the electrodes as in the case of sodium do not show up here, and the final level of removable charge capacity can be easily estimated and is about 550 mAh/g. Note that the left-hand scale does not begin until 350 mAh/g. Thus, the ratio of discharge capacity to charge capacity is roughly 75%.

The invention claimed is:

1. A method for producing a silicon anode for secondary batteries, comprising:

a. providing a monocrystalline silicon wafer with (100)-oriented front and rear flat sides;

b. contacting the rear flat side of the wafer with a flat first electrode;

c. introducing the front flat side of the wafer into an etching bath having a hydrofluoric acid-containing electrolyte and a second electrode;

d. electrochemically etching mesopores of at least 4 micrometers pore depth into the front flat side of the silicon wafer by establishing a predetermined etching current density to produce a mesoporous layer while generating a porosity between 40% and 80% in the mesoporous layer;

e. generating a microporous release layer below the mesoporous layer by increasing the etching current density;

f. placing the etched wafer in an electroplating bath;

g. electrodepositing an elemental metal into the etched mesopores to a predetermined pore depth less than 2 micrometers;

h. depositing a metal layer onto the etched front flat side of the wafer while producing electrically conductive and mechanically adherent contacts of the metal layer with the elemental metal in the mesopores; and i. lifting off the metal layer and the mesoporous, monocrystalline, (100)-oriented silicon layer partially filled with elemental metal in the mesopores while mechanically destroying the microporous release layer.

2. The method according to claim 1, wherein the monocrystalline silicon wafer is p-doped and has a resistivity of less than 10 mΩcm.

3. The method according to claim 1, wherein the pore depths of the mesopores are between 4 and 16 micrometers.

4. The method according to claim 1, wherein the porosity of the mesoporous layer is between 70% and 75%.

5. The method according to claim 1, wherein the porosity of the mesoporous layer is between 70% and 75%.

6. The method according to claim 5, wherein the electrodeposition of the copper or nickel into the mesopores takes place to a pore depth of a maximum of 3 times the diameter of the mesopores.

7. The method according to claim 5, wherein the electrodeposition of the elemental metal into the mesopores takes place to a pore depth of between 50 nanometers and 900 nanometers.

8. The method according to claim 1, wherein the metal layer is formed 1-4 micrometers thick from an elemental metal other than the elemental metal electrodeposited in the mesopores.

9. The method according to claim 1, wherein the monocrystalline silicon wafer is p-doped and has a resistivity of 7-9 mΩcm.

10. The method according to claim 1, wherein the monocrystalline silicon wafer is p-doped and has a resistivity of between 8 and 15 mΩcm.

11. The method according to claim 1, wherein the pore depths of the etched mesopores are between 6 and 12 micrometers.

12. The method according to claim 1, wherein in step h. the metal layer deposited onto the etched front flat side of the wafer is up to 4 micrometers thick.

* * * * *